United States Patent
Sheu et al.

(10) Patent No.: US 8,987,770 B2
(45) Date of Patent: Mar. 24, 2015

(54) STRUCTURE OF LIGHT EMITTING DIODE AND METHOD TO ASSEMBLE THEREOF

(75) Inventors: Sheng-Jia Sheu, Banciao (TW); Chien-Chang Pei, Taipei (TW)

(73) Assignee: Everlight Electronics Co., Ltd. (TW)

( * ) Notice: Subject to any disclaimer, the term of this patent is extended or adjusted under 35 U.S.C. 154(b) by 213 days.

(21) Appl. No.: 13/095,059

(22) Filed: Apr. 27, 2011

(65) Prior Publication Data

US 2011/0198663 A1 Aug. 18, 2011

Related U.S. Application Data

(63) Continuation of application No. 12/012,379, filed on Feb. 1, 2008, now Pat. No. 7,960,740.

(30) Foreign Application Priority Data

Feb. 26, 2007 (TW) .............................. 96106508 A

(51) Int. Cl.
*H01L 33/36* (2010.01)
*H05K 3/32* (2006.01)
*H01L 33/62* (2010.01)
*H05K 3/20* (2006.01)

(52) U.S. Cl.
CPC ............... *H05K 3/326* (2013.01); *H01L 33/62* (2013.01); *H05K 3/202* (2013.01); *H05K 2201/0382* (2013.01); *H05K 2201/10106* (2013.01); *H05K 2201/10651* (2013.01); *H05K 2201/10818* (2013.01); *H05K 2201/1084* (2013.01); *H01L 2924/0002* (2013.01)
USPC ..................... 257/99; 257/E33.066

(58) Field of Classification Search
CPC ......... H01L 33/36; H01L 33/38; H01L 33/62; H01L 2224/97; H01L 24/97; H01L 2224/48465; H01L 33/486; H01L 23/49811; H01L 24/05; H01L 33/54; H01L 24/20; H01L 27/2409; H01L 2224/05555; H01L 2224/16238; H01L 2224/02
USPC ............................. 257/99, E33.065, E33.066
See application file for complete search history.

(56) References Cited

U.S. PATENT DOCUMENTS

| | | | |
|---|---|---|---|
| 5,982,636 A * | 11/1999 | Stahl et al. | 361/807 |
| 7,070,418 B1 * | 7/2006 | Wang | 439/56 |
| 2002/0036464 A1 * | 3/2002 | Takahashi et al. | 313/512 |

(Continued)

FOREIGN PATENT DOCUMENTS

| | | |
|---|---|---|
| JP | 52-132381 | 11/1977 |
| JP | 56-162208 | 12/1981 |

*Primary Examiner* — Wael Fahmy
*Assistant Examiner* — Sarah Salerno
(74) *Attorney, Agent, or Firm* — Han IP Corporation

(57) ABSTRACT

A structure of a light emitting diode is provided. In one aspect, a light emitting diode structure comprises a light emitting diode, a conductive frame, and a substrate. The conductive frame is electrically connected to the light emitting diode and has a fixing hole connecting a first side of the conductive frame and a second side of the conductive frame opposite the first side. The fixing hole has a ladder-shaped inner sidewall with a first radius of the inner sidewall adjacent the first side smaller than a second radius of the inner sidewall adjacent the second side. The substrate has a conductive pillar that is received in the fixing hole by entering the fixing hole from the first side of the conductive frame and deformed such that the conductive pillar adheres to the ladder-shaped inner sidewall of the fixing hole.

20 Claims, 5 Drawing Sheets

(56) References Cited

U.S. PATENT DOCUMENTS

| | | | |
|---|---|---|---|
| 2005/0117356 A1* | 6/2005 | Lin | 362/456 |
| 2005/0162808 A1* | 7/2005 | Nakai | 361/301.3 |
| 2006/0102917 A1* | 5/2006 | Oyama et al. | 257/99 |
| 2006/0169999 A1* | 8/2006 | Park et al. | 257/99 |
| 2007/0096132 A1* | 5/2007 | Wu | 257/99 |
| 2008/0277684 A1* | 11/2008 | Lin et al. | 257/99 |

* cited by examiner

US 8,987,770 B2

STRUCTURE OF LIGHT EMITTING DIODE AND METHOD TO ASSEMBLE THEREOF

RELATED APPLICATIONS

This application is a continuation application of co-pending U.S. patent application Ser. No. 12/012,379, entitled "Structure of Light Emitting Diode and Method to Assemble Thereof", filed on Feb. 1, 2008, which claims priority to Taiwan Application Serial Number 096106508, filed Feb. 26, 2007. These applications are herein incorporated in their entirety by reference.

BACKGROUND

1. Technical Field

The present disclosure relates to a light emitting diode structure. More particularly, the present disclosure relates to a fixing structure of a light emitting diode and a method to assemble thereof.

2. Description of Related Art

The manufacturing technology of light emitting diodes is getting advanced recently, so that the light emitting efficiency for light emitting diodes is accordingly improved. The application of light emitting diode is based on its good characters, such as low operating temperature and low power assumption, etc. Therefore, the light emitting diode is getting more used in the light emitting field. For example, the light emitting diode is introduced to manufacture flashlights or automobile headlights.

The normal LED (Light Emitting Diode) structure consists of the die that is attached to the leadframe with an electrically conductive glue. Gold wire is used to connect the metal contact on the top of the LED die to an adjacent pin. Finally, epoxy package is molded around the leadframe. A set of pins of the leadframe extend outside the LED package. The pins can be inserted into holes in a circuit board, and be fixed on the circuit board by welding. The temperature for welding can be up to hundreds of Celsius degrees, which may be conducted to LED die and make the die burn down.

A prior structure and method of fixing a LED package on a circuit board without welding is provided. FIG. 1 illustrates a prior structure and method for fixing a LED package on a transferring board without welding. An LED package 10 includes a conductive leadframe 20. The conductive leadframe 20 has fixing holes 30. Corresponding to the locations of the fixing holes 30, holes 50 are formed on a transferring board 40 by protruding from the bottom surface to the upper surface of the transferring board 40. After the holes 50 are formed, a fixing plate 60 is naturally formed from the protruding part of the holes 50. FIG. 2 illustrates a prior structure of a LED package fixed on a transferring board without welding according to FIG. 1. The fixing plate 60 passes through the fixing holes 30, and the fixing plate 60 is bended inside out by using proper tools to fix the LED package 10 with the conductive leadframe 20 on the transferring board 40. The transferring board 40 can be used as a circuit board to transmit current to LED die and a media for heat-dissipation at the same time.

The prior structure and method for fixing a LED package on a transferring board can prevent high temperature which is generated by welding from the assembly processes. However, it is not easy to form a uniform fixing plate 60 by protruding out from the holes 50. Furthermore, the length of the fixing plate 60 is limited by the diameter of the holes 50, which is generally equal to the radii of the fixing holes 30. FIG. 3 illustrates a prior structure and method for a fixing plate passing through a fixing hole. The included angle Θ between the fixing plate 60 and the transferring board 40 herein is larger than 90 degrees, so that the fixing plate 60 can pass through the fixing hole 30 easily. However, the included angle Θ would make it difficult to bend the fixing plate 60 inside out for the following bending process. On the contrary, as the fixing plate 60 with the included angle Θ would be bended inwards, it accordingly reduce the efficiency for fixing the LED package 10 and the conductive leadframe 20 on the transferring board 40. Thus, for normally fixing the LED package 10 and the conductive leadframe 20 on the transferring board 40, the included angle Θ between the fixing plate 60 and the fixing holes 30 should be less than 90 degrees. That is, the fixing plate 60 should be bended inside out. However, it will make the fixing plate 60 passing through the fixing holes 30 difficultly. Therefore, after the fixing plate 60 passing through the fixing holes 30, it needs another process to deal with the included angle Θ between the fixing plate 60 and the transferring board 400. It's really a dilemma.

However, one more process will result in increasing cost and decreasing yield rate, even downgrading manufacture automation process. It is not the manufacturers wanted. Thus, it is very important to provide a simple and non-welding structure and method for fixing the LED package and the conductive leadframe on the transferring board.

SUMMARY

The present disclosure provides a structure of a light emitting diode and a method to assemble thereof, such that the light emitting diode can be fixed on a substrate without the issues mentioned above.

In one aspect, a light emitting diode structure may comprise: a light emitting diode; a conductive frame electrically connected to the light emitting diode, the conductive frame having a fixing hole connecting a first side of the conductive frame and a second side of the conductive frame opposite the first side, the fixing hole having a ladder-shaped inner sidewall with a first radius of the inner sidewall adjacent the first side smaller than a second radius of the inner sidewall adjacent the second side; and a substrate having a conductive pillar, the conductive pillar received in the fixing hole by entering the fixing hole from the first side of the conductive frame and deformed such that the conductive pillar adheres to the ladder-shaped inner sidewall of the fixing hole.

In one embodiment, the conductive pillar may be metal.

In one embodiment, the conductive pillar may be a hollow cylinder.

In one embodiment, a height of a top surface of the conductive pillar may be substantially equal to a height of the fixing hole from the first side to the second side of the conductive frame, the top surface being a surface of the conductive pillar furthest away from the first side of the conductive frame.

In one embodiment, a height of a top surface of the conductive pillar may be slightly higher than a height of the fixing hole from the first side to the second side of the conductive frame, the top surface being a surface of the conductive pillar furthest away from the first side of the conductive frame.

In one embodiment, a height of a top surface of the conductive pillar may be slightly lower than a height of the fixing hole from the first side to the second side of the conductive frame, the top surface being a surface of the conductive pillar furthest away from the first side of the conductive frame.

In one embodiment, the substrate may be metal such that the substrate forms a transmissible route for working current for the light emitting diode and provides a heat-dissipation surface for the light emitting diode.

In another aspect, a light emitting diode structure may comprise: a light emitting diode; a substrate having a fixing hole connecting a first side of the substrate and a second side of the substrate opposite the first side, the fixing hole having a ladder-shaped inner sidewall with a first radius of the inner sidewall adjacent the first side smaller than a second radius of the inner sidewall adjacent the second side; and a conductive frame electrically connected to the light emitting diode, the conductive frame having a conductive pillar, the conductive pillar received in the fixing hole by entering the fixing hole from the first side of the substrate and deformed such that the conductive pillar adheres to the ladder-shaped inner sidewall of the fixing hole.

In one embodiment, the conductive pillar may be a hollow cylinder.

In one embodiment, a height of a bottom surface of the conductive pillar may be substantially equal to a height of the fixing hole from the first side to the second side of the substrate, the bottom surface being a surface of the conductive pillar furthest away from the first side of the substrate.

In one embodiment, a height of a bottom surface of the conductive pillar may be slightly higher than a height of the fixing hole from the first side to the second side of the substrate, the bottom surface being a surface of the conductive pillar furthest away from the first side of the substrate.

In one embodiment, a height of a bottom surface of the conductive pillar may be slightly lower than a height of the fixing hole from the first side to the second side of the substrate, the bottom surface being a surface of the conductive pillar furthest away from the first side of the substrate.

In one embodiment, the substrate may be metal such that the substrate forms a transmissible route for working current for the light emitting diode and provides a heat-dissipation surface for the light emitting diode. Preferably, the metal may comprise gold, silver, copper, aluminum, nickel, chromium, iron, or an alloy of any combination thereof.

In yet another aspect, a method for assembling a light emitting diode structure may comprise: inserting a conductive pillar of a first conductive member through a fixing hole of a second conductive member such that the conductive pillar enters the fixing hole from a first side of the second conductive member toward a second side of the second conductive member opposite the first side, the fixing hole connecting the first side and the second side, the fixing hole having a ladder-shaped inner sidewall with a first radius of the inner sidewall adjacent the first side smaller than a second radius of the inner sidewall adjacent the second side, one of the first conductive member and the second conductive member being electrically connected to a light emitting diode; and pressing the conductive pillar to deform the conductive pillar such that the conductive pillar adheres to the ladder-shaped inner sidewall of the fixing hole.

In one embodiment, the first conductive member may be a substrate, and the second conductive member may be a conductive frame electrically connected to the light emitting diode.

In one embodiment, the first conductive member may be a conductive frame electrically connected to the light emitting diode, and the second conductive member may be a substrate.

In one embodiment, a height of a first surface of the conductive pillar may be substantially equal to a height of the fixing hole from the first side to the second side of the second conductive member, the first surface being a surface of the conductive pillar furthest away from the first side of the second conductive member.

In one embodiment, a height of a first surface of the conductive pillar may be slightly higher than a height of the fixing hole from the first side to the second side of the second conductive member, the first surface being a surface of the conductive pillar furthest away from the first side of the second conductive member.

In one embodiment, a height of a first surface of the conductive pillar may be slightly lower than a height of the fixing hole from the first side to the second side of the second conductive member, the first surface being a surface of the conductive pillar furthest away from the first side of the second conductive member.

In accordance with the foregoing disclosed structures of the present disclosure, a method for assembling a light emitting diode is provided. When a protrusive pillar passes through the fixing hole, the light emitting diode is not fixed yet. The protrusive pillar is then pressed by tools, and is deformed to hook the fixing hole. That is, the protrusive pillar fills the fixing holes, or the outer sidewalls of the protrusive pillar adhere to the inner inclined sidewalls of the fixing holes closely, so that the light emitting diode can be fixed on the substrate. The present method for assembling a light emitting diode without welding is easy and efficient. Therefore, the present disclosure provides a light emitting diode and a method to assemble thereof with low cost, high production rate and high yield rate.

These and other features, aspects, and advantages of the present disclosure will become better understood with reference to the following description, figures, and appended claims.

It is to be understood that both the foregoing general description and the following detailed description are by examples, and are intended to provide further explanation of the present disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

DESCRIPTION OF THE PREFERRED EMBODIMENTS

Figure 1:
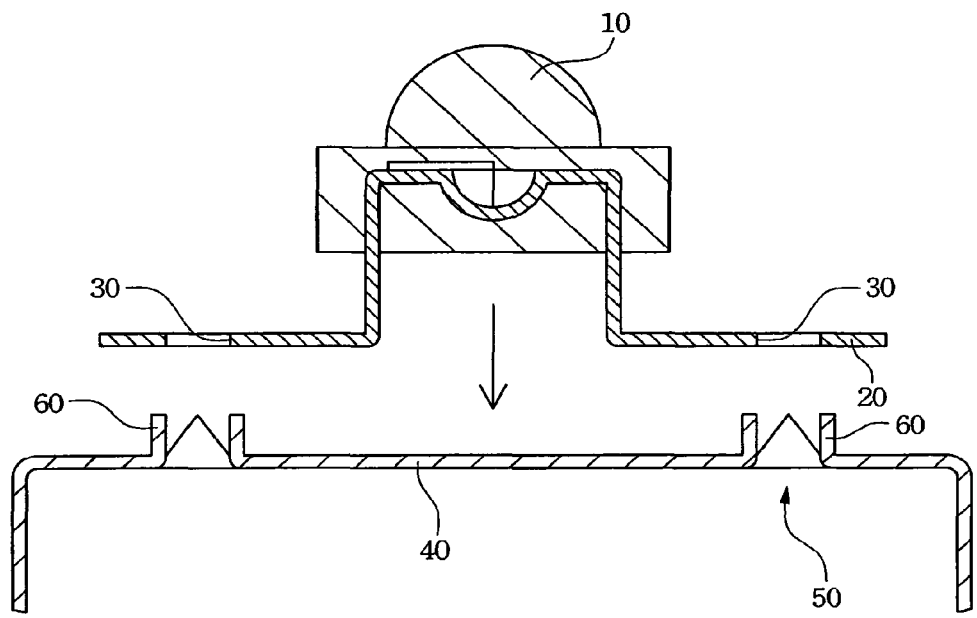
FIG. 1 is a prior structure and method for fixing a packaged light emitting diode on a transferring board without welding.
Figure 2:
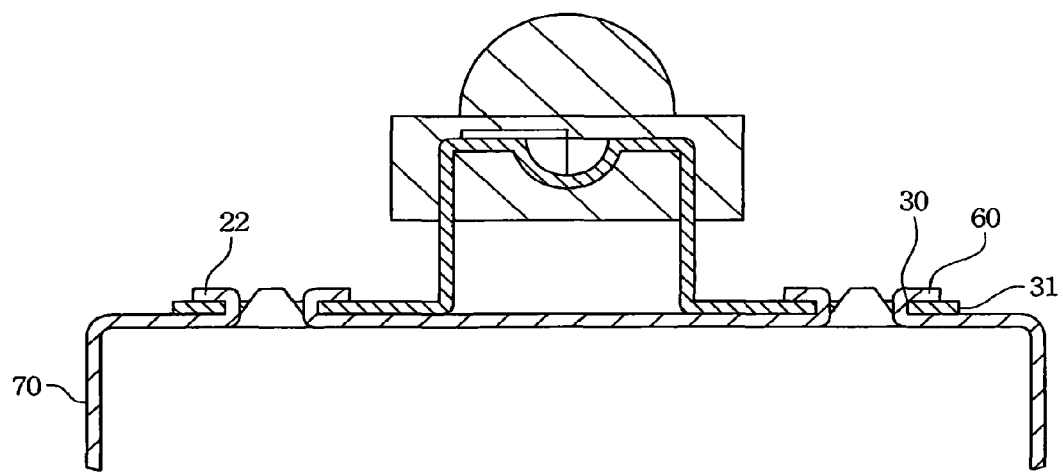
FIG. 2 is a prior structure of a light emitting diode fixed on a transferring board without welding according to FIG. 1.
Figure 3:
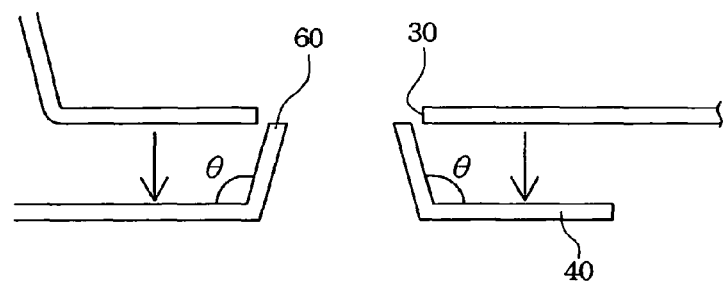
FIG. 3 is a prior structure and method for a fixing plate passing through a fixing hole.

The present disclosure provides a fixing structure of a light emitting diode, which uses riveting process rather than welding process for fixing the light emitting diode on a substrate to prevent damage of the light emitting diode chip from high temperature of the welding process. Reference will now be made in detail to the present preferred embodiments of the present disclosure, examples of which are illustrated in the accompanying drawings. Wherever possible, the same reference numbers are used in the drawings and the description to refer to the same or like parts.

Figure 4:
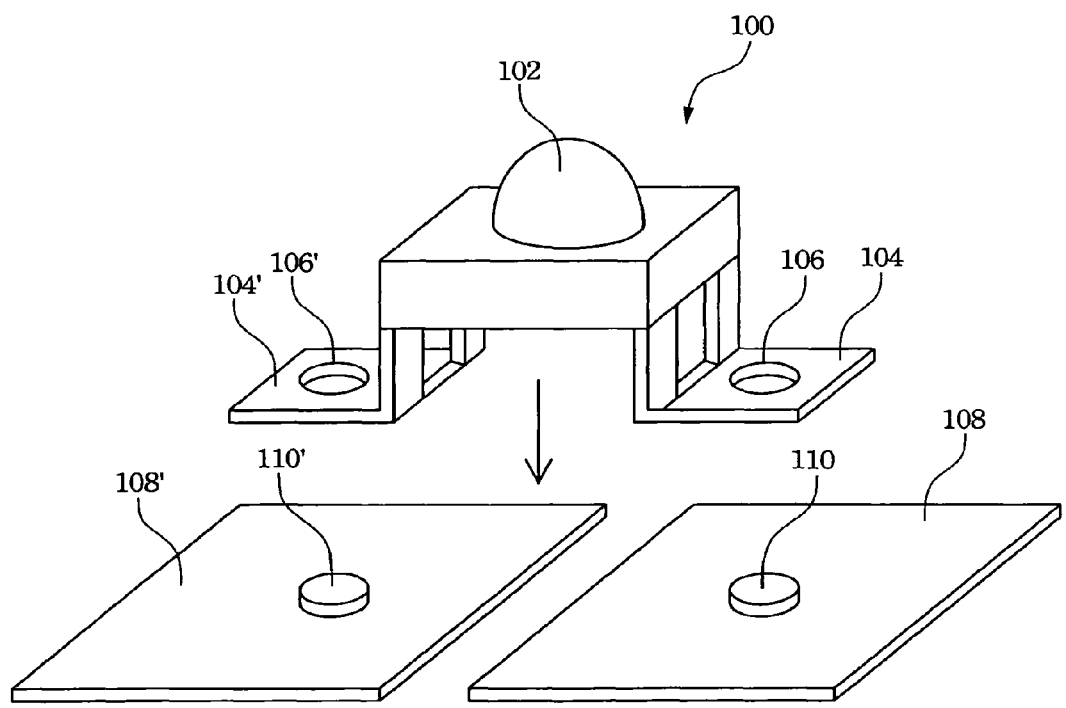
FIG. 4 is a three-dimensional explosion diagram illustrating a structure of a light emitting diode according to a general preferred embodiment of the present disclosure.

FIG. 4 is a three-dimensional explosion diagram illustrating a structure of a light emitting diode according to a general preferred embodiment of the present disclosure. As shown in FIG. 4, a packaged light emitting diode 100 has a packaged die 102 and conductive frames 104 and 104'. The conductive frames 104 and 104' electrically connect to the cathode and anode of the light emitting diode respectively (not shown). The conductive frames 104 and 104' have fixing holes 106 and 106' respectively.

Continue to FIG. 4. Protrusive pillars 110 and 110' are set on two substrates 108 and 108' respectively. According to the first preferred embodiment of the present disclosure, the protrusive pillars 110 and 110' can be hollow cylinders. The protrusive pillars 110 and 110' are drawn to cylinders by pressing mold technique. Of course, the above-mentioned example is one of the embodiments of the present disclosure, the protrusive pillars 110 and 110' are not limited to cylinders or hollow pillars, and are not limited to be formed in one piece (in an integral) with substrates 108 and 108'. A hollow or non-hollow pillar can be pressed into or screwed into the holes of the substrate.

Figure 5A:
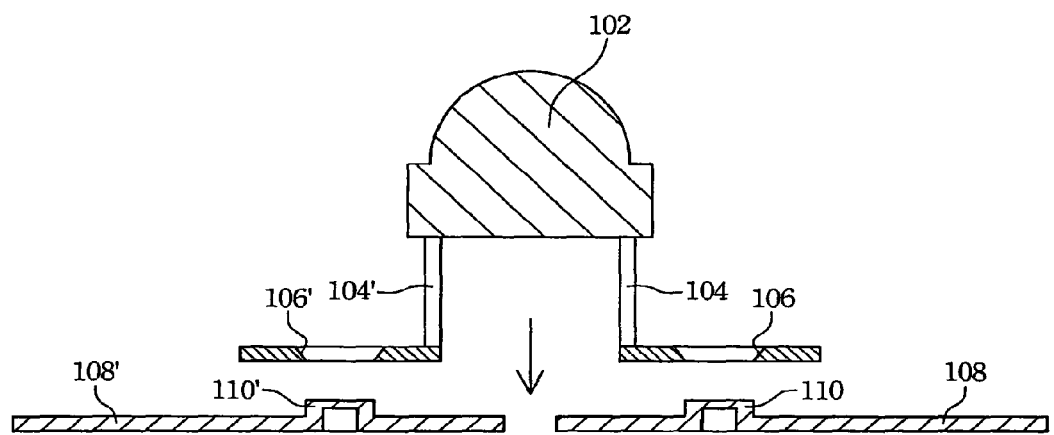
FIG. 5A is a cross-sectional view illustrating a structure and method for fixing a light emitting diode on a substrate according to a first preferred embodiment of the present disclosure.

FIG. 5A is a cross-sectional view illustrating a structure and method for fixing a light emitting diode on a substrate according to a first preferred embodiment of the present disclosure. A light emitting diode 100 has a packaged die 102 and conductive frames 104 and 104'. The conductive frames 104 and 104' electrically connect to the cathode and anode of packaged die 102 of the light emitting diode respectively (not shown). The conductive frames 104 and 104' have fixing holes 106 and 106' respectively. Protrusive pillars 110 and 110' are set on the two substrates 108 and 108' respectively. The protrusive pillars 110 and 110' can be hollow pillars. As shown in FIG. 5A, the protrusive pillar 110 passes through the fixing hole 106 and combines with the fixing hole 106, and the protrusive pillar 110' passes through the fixing hole 106' and combines with the fixing hole 106'.

Figure 5B:
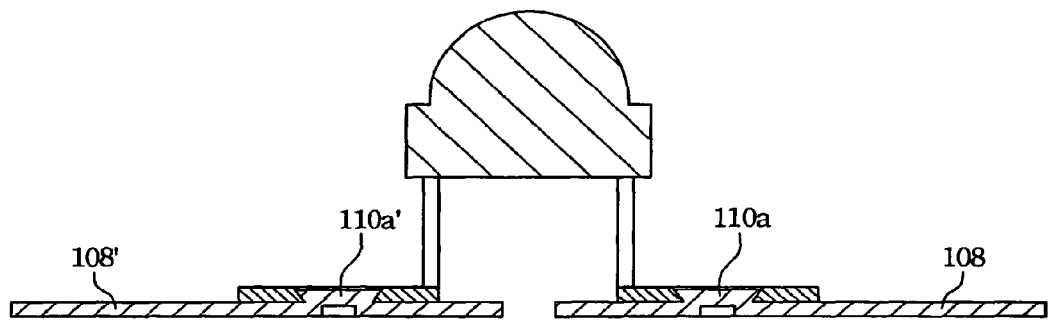
FIG. 5B is a cross-sectional view illustrating a structure of a light emitting diode fixed on a substrate according to the first preferred embodiment of the present disclosure.

FIG. 5B is a cross-sectional view illustrating a structure of a light emitting diode fixed on a substrate according to the first preferred embodiment of the present disclosure. As shown in FIG. 5B, the protrusive pillars 110 and 110' in FIG. 5A pass through the fixing holes 106 and 106' and combine with the fixing holes 106 and 106' respectively. The protrusive pillars 110 and 110' protrude out from the top surface of the substrates 108 and 108' respectively. A pressing process then is performed on the protrusive pillars 110 and 110' by using proper tools, so that the protrusive pillars 110 and 110' in FIG. 5A are deformed to become protrusive pillars 110$a$ and 110$a'$ in FIG. 5B and fill the fixing holes 106 and 106'. According to other embodiments of the present disclosure, the outer sidewalls of the protrusive pillars 110$a$ and 110$a'$ can adhere to the inner sidewalls of the fixing holes 106 and 106' closely and not fill the fixing holes 106 and 106'. Generally, the height of the top surfaces of the protrusive pillars 110$a$ and 110$a'$ can be equal to, slightly higher than or slightly lower than the height of the top surfaces of the fixing holes 106 and 106'.

Figure 6A:
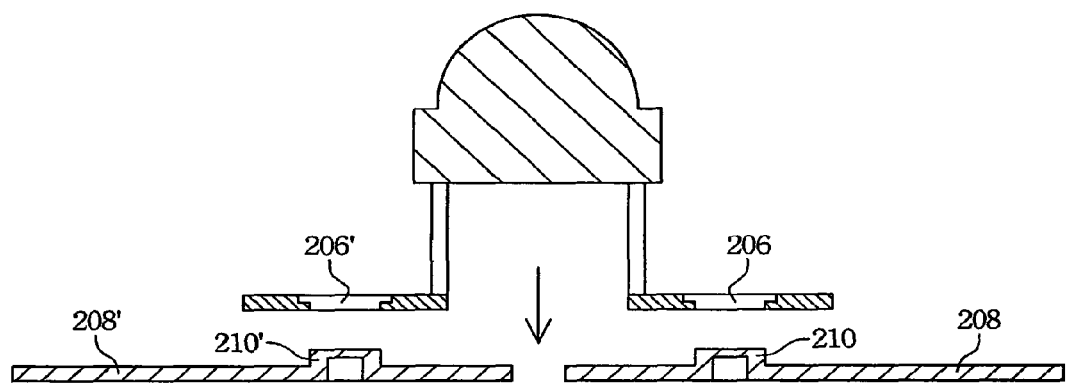
FIG. 6A is a cross-sectional view illustrating a structure and method for fixing a light emitting diode on a substrate according to a second preferred embodiment of the present disclosure.
Figure 6B:
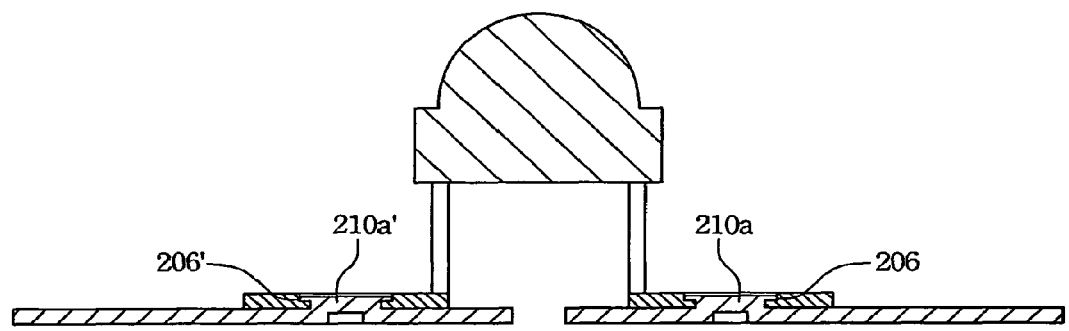
FIG. 6B is a cross-sectional view illustrating a structure of a light emitting diode fixed on a substrate according to the second preferred embodiment of the present disclosure.

FIG. 6A is a cross-sectional view illustrating a structure and method for fixing a light emitting diode on a substrate according to a second preferred embodiment of the present disclosure. And FIG. 6B is a cross-sectional view illustrating a structure of a light emitting diode fixed on a substrate according to the second preferred embodiment of the present disclosure. The differences between the embodiment of FIGS. 6A and 6B and the embodiment of FIGS. 5A and 5B are that the shapes of fixing holes 206 and 206' differ from the fixing holes 106 and 106'. As shown in FIG. 6A, the cross-sectional view of the fixing hole 206 is in a ladder shape. When protrusive pillars 210 and 210' are inserted into the fixing holes 206 and 206', a pressing process then performs on the protrusive pillars 210 and 210' by using proper tools. The protrusive pillars 210 and 210' in FIG. 6A are deformed into protrusive pillars 210$a$ and 210$a'$ in FIG. 6B and fill the fixing holes 206 and 206'. Of course, the outer sidewalls of the protrusive pillars 210$a$ and 210$a'$ may adhere to the inner sidewalls of the fixing holes 206 and 206' closely and not fill the fixing holes 206 and 206'.

Figure 7:
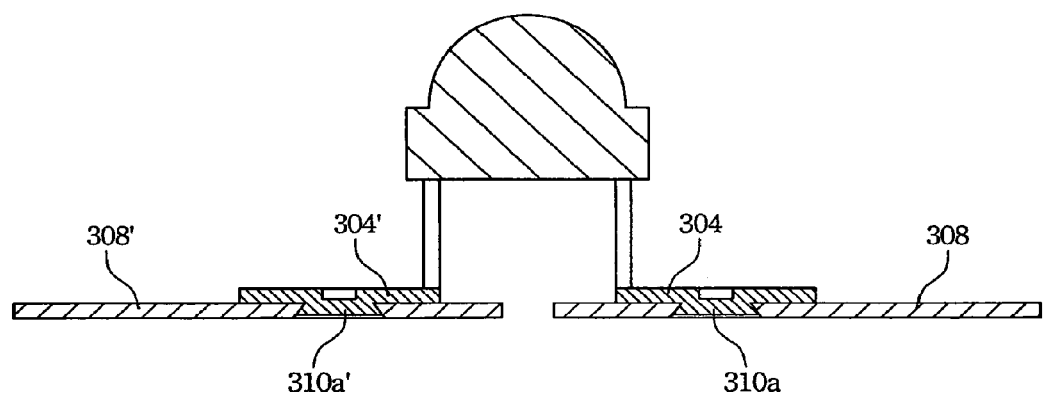
FIG. 7 is a cross-sectional view illustrating a structure of a light emitting diode fixed on a substrate according to a third preferred embodiment of the present disclosure.
Figure 8:
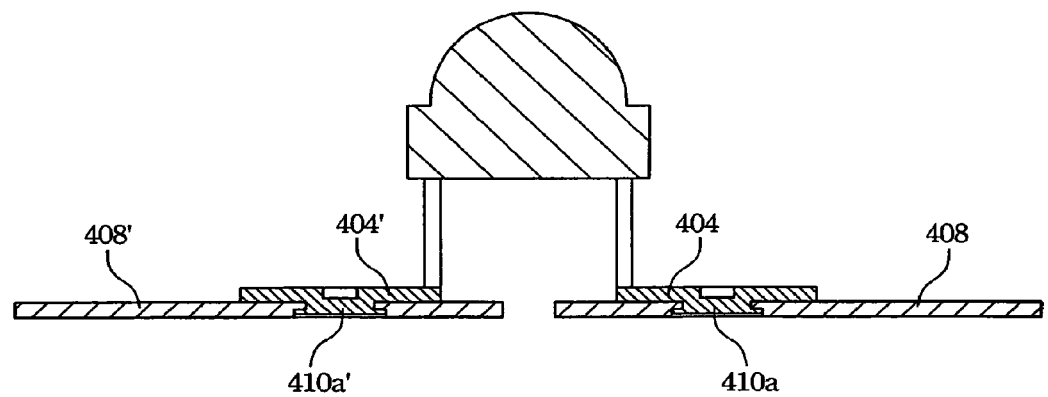
FIG. 8 is a cross-sectional view illustrating a structure of a light emitting diode fixed on a substrate according to a fourth preferred embodiment of the present disclosure.

FIG. 7 is a cross-sectional view illustrating a structure of a light emitting diode fixed on a substrate according to a third preferred embodiment of the present disclosure. FIG. 8 is a cross-sectional view illustrating a structure of a light emitting diode fixed on a substrate according to a fourth preferred embodiment of the present disclosure. As shown in FIG. 7, the structure of the third preferred embodiment of the present disclosure is like the structure of the first preferred embodiment of the present disclosure in FIG. 5B. The only difference between FIG. 7 and FIG. 5B is that the locations of the protrusive pillars 310$a$ and 310$a'$ in FIG. 7 and the locations of the protrusive pillars 110$a$ and 110$a'$ in FIG. 5B are different. The protrusive pillars 110$a$ and 110$a'$ in FIG. 5B are set on the substrates 108 and 108' respectively, while the protrusive pillars 310$a$ and 310$a'$ in FIG. 7 are set on the conductive frames 304 and 304' respectively. In detail, the protrusive pillars 310$a$ and 310$a'$ in FIG. 7 are set on the surfaces of the conductive frames 304 and 304' corresponding to the substrates 308 and 308' respectively. Other characters of the third preferred embodiment of the present disclosure are the same with the first preferred embodiment of the present disclosure and can refer to the above description for the first preferred embodiment of the present disclosure.

As shown in FIG. 8, the structure of the fourth preferred embodiment of the present disclosure is like the structure of the second preferred embodiment of the present disclosure in FIG. 6B. The only difference between FIG. 8 and FIG. 6B is that the locations of the protrusive pillars 410$a$ and 410$a'$ in FIG. 8 differ from the locations of the protrusive pillars 210$a$ and 210$a'$ in FIG. 6B. The protrusive pillars 210$a$ and 210$a'$ in FIG. 6B are set on the substrates 208 and 208' respectively, while the protrusive pillars 410$a$ and 410$a'$ in FIG. 8 are set on the conductive frames 404 and 404' respectively. In detail, the protrusive pillars 410$a$ and 410$a'$ in FIG. 8 are set on the surfaces of the conductive frames 404 and 404' corresponding to the substrates 408 and 408' respectively. Other characters of the fourth preferred embodiment of the present disclosure are the same with the second preferred embodiment of the present disclosure and can refer to the above description for the second preferred embodiment of the present disclosure.

In the above-mentioned embodiments of the present disclosure, the substrates can be used as circuit boards to transmit current to light emitting diode package. The protrusive pillars are added on the circuit board herein. The materials of the substrates can be metal, such as gold, silver, copper, aluminum, nickel, chromium, iron, or an alloy composed of the above-mentioned metals. The metal substrates not only can form a transmissible route for working current, but also can provide a heat-dissipation surface for the light emitting diode, so that the heat-dissipation efficiency is improved to prolong the lifetime of the light emitting diode.

According to the above-mentioned embodiments of the present disclosure, there are some advantages described as follows. The present structure of a light emitting diode and a method to assemble thereof is very easy and efficient, and does not need any welding process at all. Therefore, the present structure and method for fixing a LED package on a transferring board can reduce cost, and provide high production rate and high yield rate.

Although there are some embodiments have been disclosed above, they are not used to limit the scope of the present disclosure. It will be apparent to those skilled in the art that various modifications and variations can be made to the structure and method of the present disclosure without departing from the scope or spirit of the present disclosure. For example, the protrusive pillar can be pressed and deformed to fix on the top surface of the conductive frame or on the bottom surface of the substrate. A fixing hole with straight inner sidewall can be used at this time. In view of the foregoing, it is intended that the present disclosure covers modifications and variations of this present disclosure provided they fall within the scope of the following claims and their equivalents.

What is claimed is:

1. A light emitting diode structure, comprising:
   a light emitting diode;
   a conductive frame electrically connected to the light emitting diode, the conductive frame having a fixing hole traversing through the conductive frame from a first side of the conductive frame to a second side of the conductive frame opposite the first side, the fixing hole having a stepwise tapered opening with a first radius of the stepwise tapered opening adjacent the first side smaller than a second radius of the stepwise tapered opening adjacent the second side; and
   a substrate separated from the light emitting diode by the conductive frame, the substrate having a conductive pillar which is an integral part of the substrate, the conductive pillar received in the fixing hole by entering the fixing hole from the first side of the conductive frame with the conductive pillar deformed within the fixing hole between the first and the second sides of the conductive frame such that the conductive pillar adheres to the stepwise tapered opening of the fixing hole in a non-detachable manner.

2. The light emitting diode structure of claim 1, wherein the conductive pillar is metal.

3. The light emitting diode structure of claim 1, wherein the conductive pillar is a hollow cylinder.

4. The light emitting diode structure of claim 1, wherein a height of a top surface of the conductive pillar is substantially equal to a height of the fixing hole from the first side to the second side of the conductive frame, the top surface being a surface of the conductive pillar furthest away from the first side of the conductive frame.

5. The light emitting diode structure of claim 1, wherein a height of a top surface of the conductive pillar is slightly higher than a height of the fixing hole from the first side to the second side of the conductive frame, the top surface being a surface of the conductive pillar furthest away from the first side of the conductive frame.

6. The light emitting diode structure of claim 1, wherein a height of a top surface of the conductive pillar is slightly lower than a height of the fixing hole from the first side to the second side of the conductive frame, the top surface being a surface of the conductive pillar furthest away from the first side of the conductive frame.

7. The light emitting diode structure of claim 1, wherein the substrate is metal such that the substrate forms a transmissible route for working current for the light emitting diode and provides a heat-dissipation surface for the light emitting diode.

8. A light emitting diode structure, comprising:
   a light emitting diode;
   a substrate having a round fixing hole connecting a first side of the substrate and a second side of the substrate opposite the first side, the fixing hole having a stepwise tapered opening with a first radius of the stepwise tapered opening adjacent the first side smaller than a second radius of the stepwise tapered opening adjacent the second side; and
   a conductive frame electrically connected to the light emitting diode, the conductive frame having a conductive pillar which is an integral part of the conductive frame, the conductive pillar received in the fixing hole by entering the fixing hole from the first side of the substrate with the conductive pillar deformed to conform to the first radius and the second radius of the fixing hole such that the conductive pillar adheres to the substrate, in a non-detachable manner, due to deformation of the conductive pillar in the stepwise tapered opening of the fixing hole and not due to an additional component.

9. The light emitting diode structure of claim 8, wherein the conductive pillar is a hollow cylinder.

10. The light emitting diode structure of claim 8, wherein a height of a bottom surface of the conductive pillar is substantially equal to a height of the fixing hole from the first side to the second side of the substrate, the bottom surface being a surface of the conductive pillar furthest away from the first side of the substrate.

11. The light emitting diode structure of claim 8, wherein a height of a bottom surface of the conductive pillar is slightly higher than a height of the fixing hole from the first side to the second side of the substrate, the bottom surface being a surface of the conductive pillar furthest away from the first side of the substrate.

12. The light emitting diode structure of claim 8, wherein a height of a bottom surface of the conductive pillar is slightly lower than a height of the fixing hole from the first side to the second side of the substrate, the bottom surface being a surface of the conductive pillar furthest away from the first side of the substrate.

13. The light emitting diode structure of claim 8, wherein the substrate is metal such that the substrate forms a transmissible route for working current for the light emitting diode and provides a heat-dissipation surface for the light emitting diode.

14. The light emitting diode structure of claim 13, wherein the metal comprises gold, silver, copper, aluminum, nickel, chromium, iron, or an alloy of any combination thereof.

15. A method for assembling a light emitting diode structure, the method comprising:

inserting a conductive pillar, which is an integral part of a first conductive member, through a fixing hole of a second conductive member such that the conductive pillar enters the fixing hole from a first side of the second conductive member toward a second side of the second conductive member opposite the first side, the fixing hole traversing through the second conductive member from the first side to the second side, the fixing hole having a stepwise tapered opening with a first radius of the stepwise tapered opening adjacent the first side smaller than a second radius of the stepwise tapered opening adjacent the second side, one of the first conductive member and the second conductive member being electrically connected to a light emitting diode; and pressing the conductive pillar to deform the conductive pillar within the fixing hole between the first and the second sides of the second conductive member such that the conductive pillar of the first conductive member adheres to the second conductive member, in a non-detachable manner, due to deformation of the conductive pillar in the stepwise tapered opening of the fixing hole and not due to an additional component.

16. The assembling method of claim 15, wherein the first conductive member is a substrate, and wherein the second conductive member is a conductive frame electrically connected to the light emitting diode.

17. The assembling method of claim 15, wherein the first conductive member is a conductive frame electrically connected to the light emitting diode, and wherein the second conductive member is a substrate.

18. The light emitting diode structure of claim 15, wherein a height of a first surface of the conductive pillar is substantially equal to a height of the fixing hole from the first side to the second side of the second conductive member, the first surface being a surface of the conductive pillar furthest away from the first side of the second conductive member.

19. The light emitting diode structure of claim 15, wherein a height of a first surface of the conductive pillar is slightly higher than a height of the fixing hole from the first side to the second side of the second conductive member, the first surface being a surface of the conductive pillar furthest away from the first side of the second conductive member.

20. The light emitting diode structure of claim 15, wherein a height of a first surface of the conductive pillar is slightly lower than a height of the fixing hole from the first side to the second side of the second conductive member, the first surface being a surface of the conductive pillar furthest away from the first side of the second conductive member.

* * * * *